United States Patent
Kurita et al.

(10) Patent No.: US 6,900,522 B2
(45) Date of Patent: May 31, 2005

(54) CHAMFERED SEMICONDUCTOR WAFER AND METHOD OF MANUFACTURING THE SAME

(75) Inventors: Hideki Kurita, Kitaibaraki (JP); Masashi Nakamura, Toda (JP)

(73) Assignee: Nikko Materials Co., Ltd., Tokyo (JP)

( * ) Notice: Subject to any disclaimer, the term of this patent is extended or adjusted under 35 U.S.C. 154(b) by 0 days.

(21) Appl. No.: 10/472,518

(22) PCT Filed: Dec. 17, 2002

(86) PCT No.: PCT/JP02/13164

§ 371 (c)(1), (2), (4) Date: Sep. 24, 2003

(87) PCT Pub. No.: WO03/060965

PCT Pub. Date: Jul. 24, 2003

(65) Prior Publication Data

US 2004/0113236 A1 Jun. 17, 2004

(30) Foreign Application Priority Data

Jan. 11, 2002 (JP) ........................ 2002-004124

(51) Int. Cl.[7] ........................ H01L 29/06; H01L 21/30
(52) U.S. Cl. ........................ 257/618; 438/255; 451/44
(58) Field of Search ................ 438/455–460, 438/690–692, 413; 257/E21.237, 618, 620, E21.23, E21.238, E21.239, E21.002, E21.022; 427/289; 451/53, 44

(56) References Cited

U.S. PATENT DOCUMENTS

| | | | | |
|---|---|---|---|---|
| 5,514,025 A | * | 5/1996 | Hasegawa et al. | ............ 451/44 |
| 6,234,879 B1 | * | 5/2001 | Hasegawa et al. | ............ 451/44 |
| 6,284,658 B1 | * | 9/2001 | Kato et al. | ................. 438/690 |
| 6,583,029 B2 | * | 6/2003 | Abe et al. | ................... 438/455 |

FOREIGN PATENT DOCUMENTS

| | | | | |
|---|---|---|---|---|
| EP | 1 150 339 | | * 10/2001 | ........... H01L/21/02 |
| JP | 2-275613 A | | 11/1990 | |
| JP | 02-275613 | | * 11/1990 | ........... H01L/21/02 |
| JP | 6-61201 A | | 3/1994 | |
| JP | 06-061201 | | * 3/1994 | ......... H01L/21/304 |
| JP | 9-251934 A | | 9/1997 | |
| JP | 09251934 | | * 9/1997 | ........... H01L/21/02 |

* cited by examiner

Primary Examiner—Long Pham
Assistant Examiner—Thao X. Le
(74) Attorney, Agent, or Firm—Birch, Stewart, Kolasch & Birch, LLP

(57) ABSTRACT

In a semiconductor wafer (W) having a periphery thereof chamfered, and having at least a main surface side thereof subjected to mirror finishing, an inclined surface (21) is formed on the periphery of the wafer, such that has an angle ($\theta$) of inclination of the inclined surface (21) with respect to a main surface (10) is not smaller than 5° and not larger than 25°, and at the same time a length (L) of the same in the radial direction of the wafer is 100 $\mu$m or longer. Further, the inclined surface is configured to have a non-mirror-finished portion (21b) toward the periphery of the wafer.

8 Claims, 3 Drawing Sheets

Prior Art

CHAMFERED SEMICONDUCTOR WAFER AND METHOD OF MANUFACTURING THE SAME

This application is the national phase under 35 U.S.C. § 371 of PCT International Application No. PCT/JP02/13164 which has an International filing date of Dec. 17, 2002, which designated the United States of America.

TECHNICAL FIELD

The present invention relates to a semiconductor wafer having an epitaxial layer grown on its surface and a method of manufacturing the same, and more particularly to a technique of effectively preventing defects, such as microcracks, from occurring in a periphery of the wafer when the epitaxial layer is grown.

BACKGROUND ART

Conventionally, a machining process, called chamfering, is generally carried out on the periphery of a semiconductor wafer so as to prevent chipping or cracking from occurring during the process of manufacturing a semiconductor device. The method of chamfering includes a method of machining the periphery of a semiconductor wafer into an arcuate shape such that a surface on which an epitaxial film is grown (hereinafter referred to as "the main surface") and a back surface are connected by a smooth curve, and a method of machining the periphery of the semiconductor wafer into a tapered shape such that the main surface and the back surface are prevented from meeting an end face of the periphery at right angles. Particularly when the periphery is machined into an arcuate shape, the main surface and the back surface of a semiconductor wafer are connected by a perfect smooth arc, which is very advantageous in preventing cracking or chipping from occurring in the periphery of the wafer.

The semiconductor wafer thus chamfered has the main surface alone or both the main and back surfaces mirror-finished, and then has an epitaxial film of one of various compositions grown on the main surface.

However, when the semiconductor wafer chamfered by such a method as described above and having the main surface side thereof mirror-finished is used as a substrate to grow an epitaxial film on its main surface, a normal epitaxial film is formed on the main surface and a portion of a chamfered portion toward the main surface, but an extraordinary growth without monocrystallinity sometimes occurs in a portion of the chamfered portion toward the periphery of the wafer. Further, due to a distortion caused by the extraordinary growth and a distortion inherent to the grown epitaxial film, wedge-shaped defects, called microcracks, sometimes occur, which extend from the extraordinary growth to the epitaxial film.

Then, with the distortion inside the crystal or the wedge-shaped cuts (microcracks) as a start, the substrate is sometimes broken after the epitaxial growth. It should be noted that occurrence of such a phenomenon tends to be marked with an increase in the thickness of the epitaxial film.

The present invention has been made to provide a solution to the above problems, and an object thereof is to provide a semiconductor wafer which is capable of effectively preventing microcracks from being formed in a periphery of the wafer when epitaxial growth is performed on the main surface thereof, and the wafer from being broken with the microcracks as a start, and a method of manufacturing the same.

DISCLOSURE OF THE INVENTION

Now, brief description will be given of key points leading up to the completion of this invention.

In the first place, the present inventors studied the mechanism of breakage of a semiconductor wafer with an epitaxial film occurring when epitaxial growth is performed by using, as a substrate, a semiconductor wafer having a periphery thereof machined into an arcuate shape such that the main and back surfaces are connected by a smooth curve.

More specifically, an experiment was carried out in which epitaxial growth was performed on a semiconductor wafer having a thickness of 500 μm and chamfered to a radius of 250 μm, and an epitaxial film thus grown was investigated. Results of this experiment are shown in FIGS. 4 and 5.

FIG. 4 is a diagram schematically showing a semiconductor wafer with an epitaxial film obtained by the above experiment. As shown in FIG. 4, an epitaxial layer 30 having normal monocrystallinity was formed on the main surface 10 and a portion of the chamfered portion 20 closer to the main surface 10, and an extraordinary growth 50 was formed on a portion of the chamfered portion 20 toward the periphery.

FIG. 5 shows an enlarged view of a wafer peripheral portion (boundary between the epitaxial film 30 and the extraordinary growth 50) of the chamfered portion 20. As shown in this figure, microcracks C were found to be produced which extended from the boundary between the extraordinary growth 50 and the epitaxial film 30 to the inside of the epitaxial film 30.

From these results, it was found that when the wafer periphery is chamfered into an arcuate shape, an extraordinary growth occurs in the chamfered portion (particularly toward the periphery), and microcracks C are produced in the boundary between the extraordinary growth and the epitaxial film.

Further, the present inventors investigated into the cause of the extraordinary growth based on the results of the above experiment, and reached an idea that extraordinary growth tends to occur since the plane direction of a portion of the chamfered portion toward the periphery is much inclined with respect to that of the main surface. On the other hand, it was presumed that a distortion caused by the extraordinary growth and a distortion caused by a lattice mismatch between the epitaxial film and the substrate causes microcracks to be more readily produced in the epitaxial film which is susceptible to the stress of these distortions. More specifically, it was presumed that in the boundary between the epitaxial film 30 and the extraordinary growth 50, a monocrystalline portion and a non-monocrystalline portion are adjacent to each other, and hence a distortion caused by these portions evokes the occurrence of microcracks, which then extend toward the center of the wafer.

Then, based on a finding that by using a semiconductor wafer formed such that the plane direction of the chamfered portion is not much inclined with respect to the plane direction of the main surface, occurrence of an extraordinary growth can be prevented and further occurrence of microcracks can be suppressed, we invented a method of forming an inclined surface having a plane direction relatively closer to that of the main surface over at least a predetermined length on a periphery of the wafer main surface. This eliminates a steep boundary between the main surface and the chamfered portion, thereby allowing the crystallographic direction (plane direction) of the surface to be gently changed.

Next, the present inventors made experiments on a semiconductor wafer having the above-mentioned inclined surface formed on the periphery of the main surface thereof, and the peripheral end thereof machined into an arcuate shape for effectively preventing chipping or cracking from occurring in the wafer. More specifically, an experiment of epitaxial growth was performed by using, as a substrate, a semiconductor wafer having an inclined surface 21 formed on the periphery of the main surface 10, and further having an arcuately-shaped portion 22 formed on the outermost peripheral portion of the wafer, as shown in FIG. 1. As a result, it was found that extraordinary growth occurred on the arcuately shaped portion 22. This result could be easily expected from the preceding experiment described above.

Now, we studied a method of reducing the distortion between the extraordinary growth and the epitaxial film, and invented a technique of carrying out mirror polishing such that a portion (toward the periphery) of the inclined surface 21 is not mirror surfaced.

FIG. 2 is a diagram schematically showing a semiconductor wafer with an epitaxial film obtained by epitaxial growth using, as a substrate, a semiconductor wafer subjected to the mirror polishing by the above-mentioned technique. That is, when the epitaxial growth was carried out by using as the substrate the semiconductor wafer subjected to the mirror polishing by the above-mentioned technique, an epitaxial film 30 was formed on the main surface 10 and a mirror-finished inclined surface 21a, while a growth film 40 which was not completely monocrystalline was formed on a non-mirror-finished inclined surface 21b, and an extraordinary growth 50 was formed on an arcuately-shaped portion 22.

In this case, existence of the non-mirror-finished inclined surface 21b having a plane direction close to that of the main surface between the main surface 10 and the arcuately-shaped portion 30 prevented the abnormal growth from extending beyond the non-mirror-finished portion to the vicinity of the main surface. Further, microcracks did not occur in a thin film formed on the non-mirror-finished inclined surface 21b, either.

That is, even if the extraordinary growth 50 was formed on the arcuately shaped portion 22, the growth layer 40 formed on the non-mirror-finished portion 21b played the role of a buffer, whereby the distortion caused by the extraordinary growth was prevented from extending to the epitaxial film 30. Further, the growth layer 40 which was not completely monocrystalline could reduce the distortion caused by the extraordinary growth 50, which made it possible to prevent microcracks from being caused by the distortion.

Then, the present inventors studied an angle θ of the inclined surface 21 of the chamfered portion 20 to the main surface and a length L of the inclined surface in a radial direction of the wafer. More specifically, an experiment was carried out as follows: in the FIG. 1 semiconductor wafer, the inclination of the inclined surface with respect to the main surface was changed within a range of 0 to 45 and the chamfering was performed on each wafer having a different angle of the inclination such that the length L of the inclined surface 21 was within a range of 50 to 1000 μm. On each wafer thus obtained, the same mirror finishing was carried out, and a length L2 of a non-mirror-finished surface was measured. Further, films epitaxially grown using the wafers as a substrate were investigated.

Results of the experiment are shown in FIG. 3. From this experiment, it was found that when the inclination angle of the inclined surface is equal to or larger than 25°, an extraordinary growth occurs on the inclined surface 21 irrespective of the length L thereof in the radial direction of the wafer.

Further, it was found that when the length L of the inclined surface 21 in the radial direction of the wafer is set to 100 μm or shorter (indicated by the marks of ♦ and ■ in FIG. 3), microcracks are produced in a growth film (epitaxial film) adjacent to the extraordinary growth 50 occurring in the arcuately shaped portion 22. From this, it can be presumed that when the length L of the inclined surface 21 in the radial direction of the wafer is set to 100 μm or shorter, there is no or very short non-mirror-finished portion formed on the inclined surface 21, which allows a normal monocrystalline epitaxial film to be formed substantially on the entire inclined surface 21, and therefore produces a distortion between the epitaxial film and the extraordinary growth, causing microcracks to occur. In view of this, the mirror finishing is configured such that execution thereof leaves a non-mirror-finished portion having a length of 50 μm or longer.

From the above results of the experiments, we finally found out that by forming the inclined surface 21 by chamfering such that the inclined surface 21 has an angle of inclination which is not smaller than 5° and not larger than 25°, it is possible to prevent an extraordinary growth from occurring in the inclined surface 21, and at the same time, by performing the mirror finishing such that a non-mirror-finished portion 21b which is 50 μm or longer remains on the inclined surface 21, it is possible to effectively prevent occurrence of microcracks, which is ascribable to the distortion caused by the extraordinary growth.

The present invention has been completed based on the above finding, and provides a semiconductor wafer having a periphery thereof chamfered, and having at least a main surface side thereof subjected to mirror finishing, wherein the periphery of the wafer has an inclined surface having an angle of inclination which is not smaller than 5° and not larger than 25°.

This makes it possible to prevent extraordinary growth from occurring in a chamfered portion (inclined surface) formed on the wafer periphery, and hence also prevents microcracks from being caused by a distortion of an epitaxial film and the extraordinary growth.

Further, by setting the length of the inclined surface in a radial direction of the wafer to 100 μm or longer, it is possible to effectively avoid cracking or chipping from occurring during the process of manufacturing a semiconductor device.

Further, the inclined surface is configured to have a non-mirror-finished portion toward the periphery of the wafer. That is, by forming a growth film which is not completely monocrystalline (mixture of a single crystal and a non-monocrystalline crystal) on the non-mirror-finished portion, the distortion between the same and the extraordinary growth portion (non-monocrystalline crystal) can be reduced, whereby occurrence of microcracks due to such a distortion can be avoided. Preferably, the length of the non-mirror-finished portion is 50 μm or longer.

Further, when a process of manufacturing a semiconductor wafer comprises a chamfering step of forming an inclined surface of which an angle of inclination with respect to a main surface is not smaller than 5° and not larger than 25° and of which a length in a radial direction of the wafer is not shorter than 100 μm, on a periphery of a wafer, and a mirror-finishing step of performing polishing such that a non-mirror-finished portion remains on a portion of the inclined surface on a main-surface side toward the periphery of the wafer, it is possible to produce a semiconductor wafer suitable for the use of a substrate for epitaxial growth.

Further, by forming an epitaxial growth film on a main surface of the above semiconductor wafer used as a substrate, it is possible to obtain a high-quality semiconductor wafer with an epitaxial film.

BEST MODE FOR CARRYING OUT THE INVENTION

Preferred embodiments of the invention will be described hereafter with reference to the drawings.

First, a single crystal of n-type InP was grown in a <100> direction by LEC (liquid encapsulated Czochralski). The single crystal was machined into a cylindrical shape having a diameter of 2 inches, and a semiconductor wafer W was cut out therefrom by slicing such that a surface of the wafer W forms a <100> surface.

Figure 1:
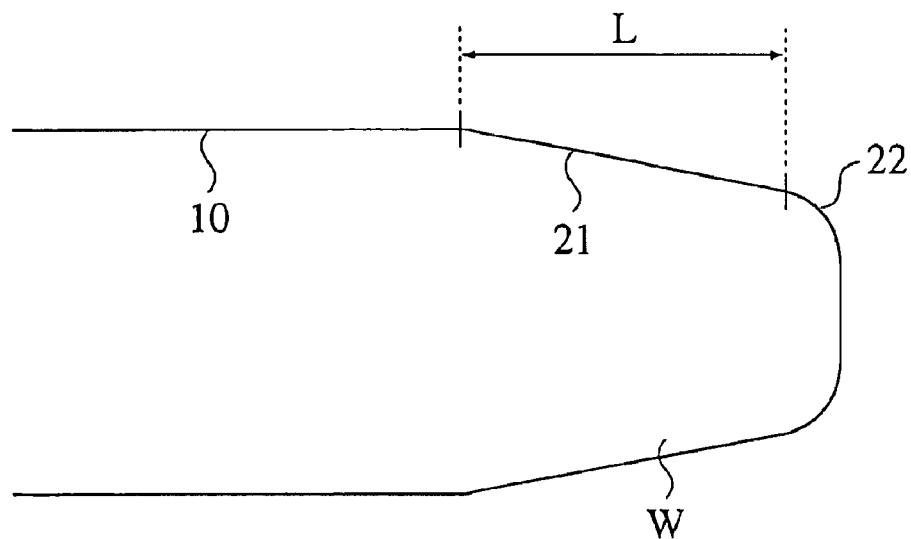
FIG. 1 a schematic diagram of a semiconductor wafer according to the present invention.
Figure 2:
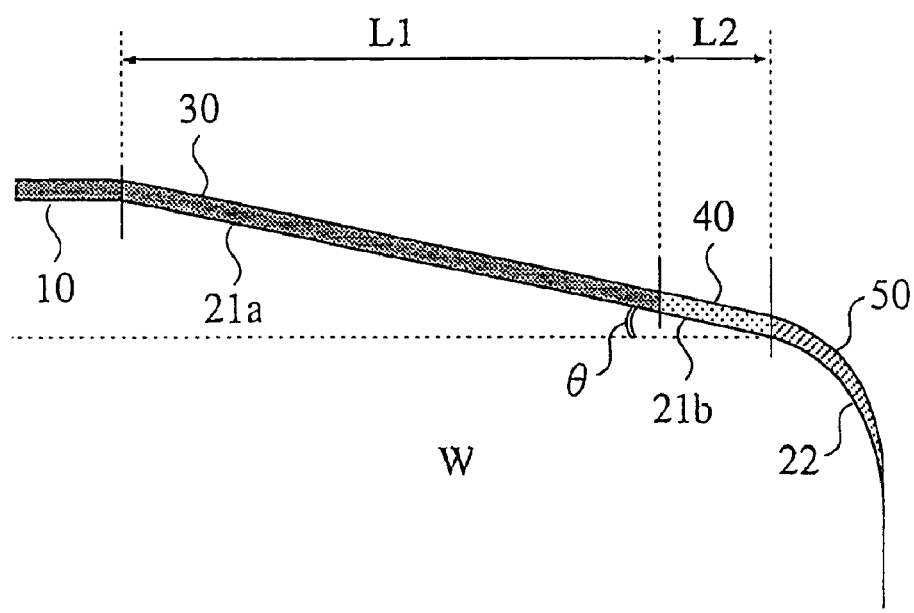
FIG. 2 is a schematic diagram of a main surface side of the semiconductor wafer according to the present invention as a substrate on which epitaxial growth is performed.
Figure 3:
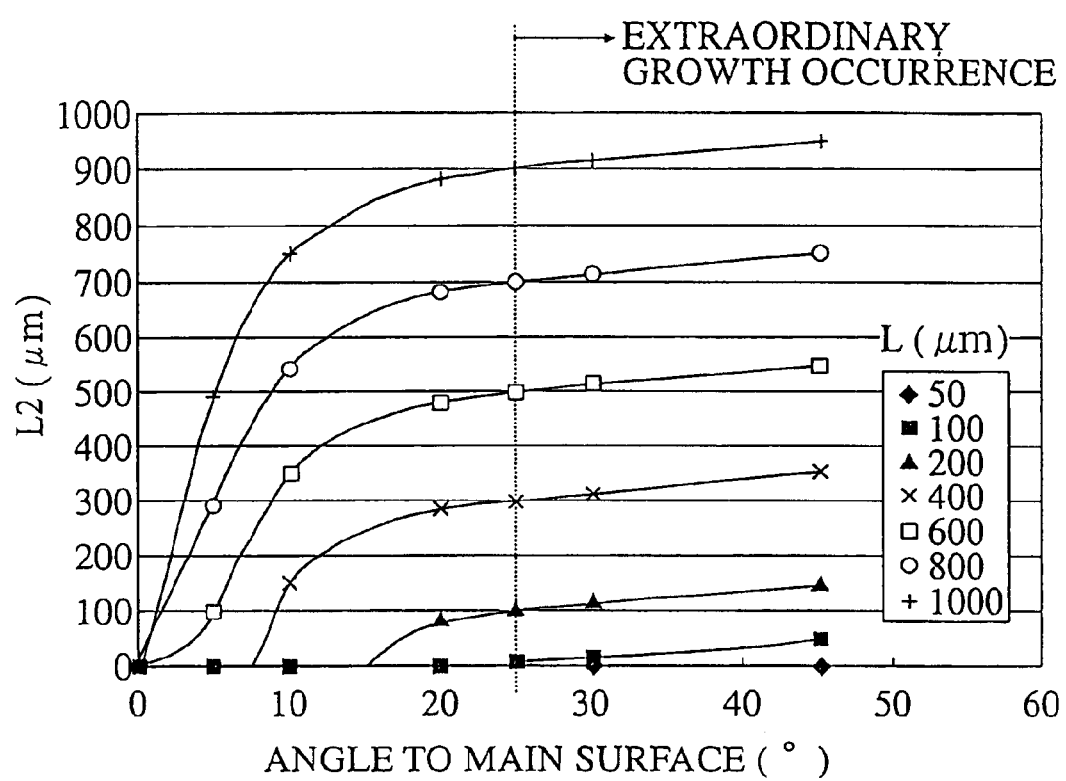
FIG. 3 is a graph showing the relationship between an angle of inclination θ of an inclined surface, length L of the same in a radial direction of the wafer, and length L2 of a non-mirror-finished portion.
Figure 4:
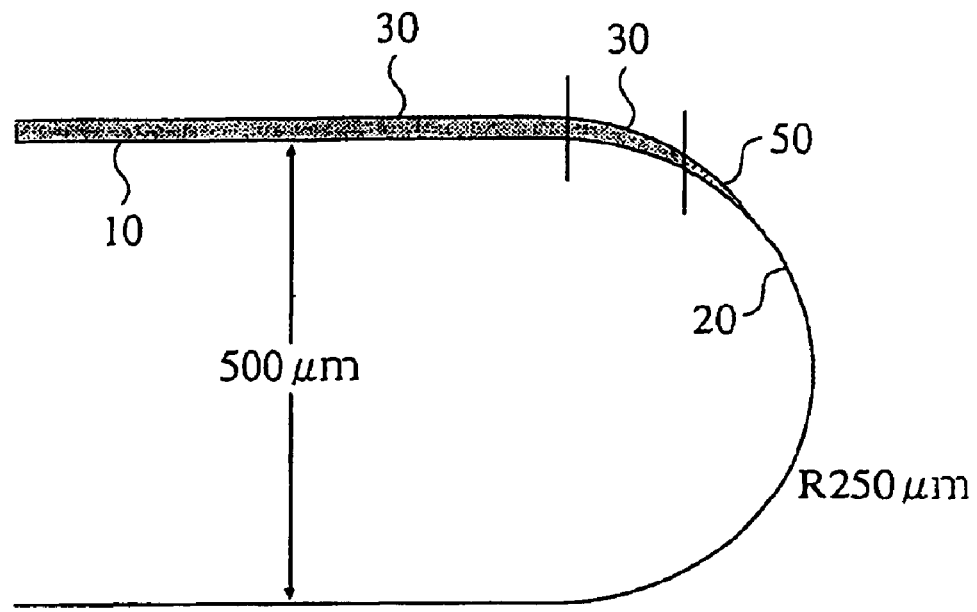
FIG. 4 is a schematic diagram of a semiconductor wafer with an epitaxial film, obtained by performing epitaxial growth using a semiconductor wafer chamfered by the prior art, as a substrate.
Figure 5:
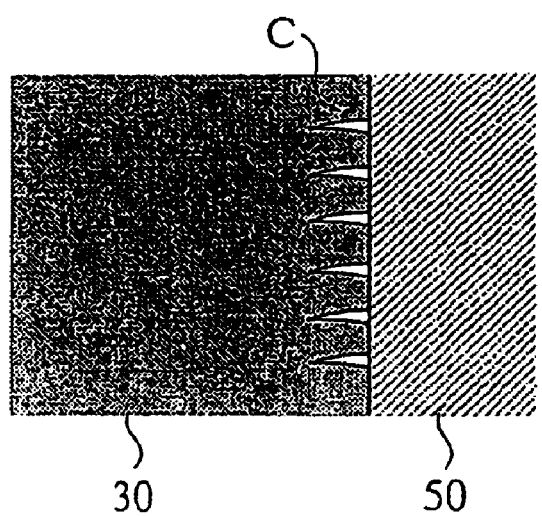
FIG. 5 is an enlarged view of a chamfered portion 20 appearing in FIG. 4, showing details of a peripheral portion (boundary between an epitaxial film 30 and an extraordinary growth 50) of a wafer main surface.

Then, the periphery of the semiconductor wafer W was chamfered by grinding into a chamfered shape as shown in FIG. 1. At this time, on a main surface side, an inclined surface 21 was formed which was inclined at an angle of 11° to the <100> surface as the main surface 10. Further, outward of the inclined surface, an arcuately shaped portion 22 was formed.

Next, the surfaces of the semiconductor wafer W were subjected to mirror polishing. The length L of the inclined surface 21 formed by the chamfering process had been set such that at the time point the mirror polishing was finished, the length L of the inclined surface 21 became equal to 300 μm. The length L2 of a non-mirror-finished portion at this time was 50 μm. This setting value can be geometrically determined by setting the width of a portion of the surface to be removed after the chamfering to a fixed value.

Next, by using the semiconductor wafer W chamfered and mirror-finished as described above as the substrate, an epitaxial film was grown which has a composition of InP (1 μm)/InGaAs (4 μm)/InP(1 μm) by MOCVD (metallorganic vapor phase epitaxy). This structure is widely employed for optical devices, such as PIN photodiodes.

Then, after the epitaxial growth, the surface of the epitaxial film was observed, but no defects, such as extraordinary growths or microcracks, were found.

Next, for comparison, similarly to the embodiment, a semiconductor wafer was formed by subjecting a wafer cut out from an InP single crystal ingot to conventional chamfering such that the main surface and the back surface of the wafer were connected by a smooth arcuate edge, and farther to mirror polishing, and epitaxial growth was carried out by using the semiconductor wafer as a substrate. The surface of the epitaxial film was observed. As a result, extraordinary growths were found here and there in the periphery of the wafer (chamfered portion). Further, microcracks extending from the extraordinary growths to the center of the wafer were found to have occurred.

In the present embodiment, the inclined surface having an angle of inclination of 11° with respect to the main surface was formed on the periphery of the wafer, and then, the length of the inclined surface in the radial direction of the wafer was set to 300 μm. This made it possible to prevent extraordinary growth from occurring in a chamfered portion (inclined surface) of the main surface side of the wafer periphery, and prevent microcracks from occurring due to a distortion of the epitaxial film and the extraordinary growth.

The present invention made by the present inventors has been described heretofore based on the preferred embodiment. However, the present invention is by no means limited to the above embodiment, but can be changed or modified without departing from the subject matter of the invention.

For instance, the angle of inclination of the inclined surface may be changed within a range of 5° to 25°, and by forming the inclined surface such that the radial length thereof after the mirror finishing becomes 100 μm or longer, the same advantageous effects can be obtained.

It should be noted that a portion of the inclined surface remaining after the mirror finishing as a non-mirror-finished surface is preferably equal to 50 μm or longer, and so long as this condition is satisfied, processing conditions of the mirror finishing are not particularly limited.

According to the present invention, in a semiconductor wafer having a periphery thereof chamfered, and having at least a main surface side thereof subjected to mirror finishing, the periphery of the wafer has an inclined surface having an angle of inclination with respect to a main surface which is not smaller than 5° and not larger than 25°, and at the same time the length of the inclined surface in the radial direction of the wafer is set to 100 μm or longer. Further, the inclined surface is configured to have a non-mirror-finished portion toward the periphery of the wafer. Therefore, the present invention has the advantageous effects of being capable of preventing extraordinary growth from occurring in a chamfered portion (inclined surface) of the wafer periphery, and at the same time preventing microcracks from occurring due to a distortion of the epitaxial film and the extraordinary growth.

INDUSTRIAL APPLICABILITY

Although the above description has been mainly given of the case of using a semiconductor wafer of an InP single crystal as a substrate, and epitaxially growing an InP/InGaAs/InP layer on a main surface thereof, the present invention is by no means limited to this, but it can be widely applied to cases of using a semiconductor single crystal of III–V group elements or another semiconductor single crystal as a substrate, and epitaxially growing a compound semiconductor layer having a lattice constant relatively closer to that of the substrate on a main surface of the substrate.

What is claimed is:

1. A semiconductor wafer having a periphery thereof chamfered, and having at least a main surface side thereof subjected to mirror finishing, wherein the periphery has an inclined surface having an angle of inclination with respect to a main surface which is not smaller than 5° and not larger than 25°, and is configured to have a non-mirror-finished portion toward the periphery of the wafer, and wherein the non-mirror-finished portion is on a portion of the inclined surface on a main-surface side toward the periphery of the wafer.

2. The semiconductor wafer as claimed in claim 1, wherein a length of the inclined surface in a radial direction of the wafer is equal to or longer than 100 µm.

3. The semiconductor wafer having an epitaxial growth film formed on a semiconductor wafer as claimed in claim 1 as a substrate.

4. The semiconductor wafer having an epitaxial growth film formed on a semiconductor wafer as claimed in claim 2 as a substrate.

5. The semiconductor wafer as claimed in claim 1, wherein a length of the inclined surface in a radial direction of the non-mirror finished portion is 50 µm or more.

6. The semiconductor wafer having an epitaxial growth film formed on a semiconductor wafer substrate as claimed in claim 3, wherein the semiconductor wafer substrate is an InP crystal.

7. The semiconductor wafer having an epitaxial growth film formed on a semiconductor wafer as claimed in claim 3, wherein the epitaxial growth film is InP/InGaAs/InP.

8. A method of manufacturing a semiconductor wafer, comprising a chamfering step of forming an inclined surface of which an angle of inclination with respect to a main surface is not smaller than 5° and not larger than 25° and of which a length in a radial direction of the wafer is not shorter than 100 µm, on a periphery of the wafer, and a mirror-finishing step of performing polishing such that a non-mirror-finished portion remains on a portion of the inclined surface on a main-surface side toward the periphery of the wafer.

* * * * *